United States Patent
Wada

(10) Patent No.: US 6,470,564 B1
(45) Date of Patent: Oct. 29, 2002

(54) METHOD OF MANUFACTURING ALUMINUM-STABILIZED SUPERCONDUCTING WIRE

(75) Inventor: Katsunori Wada, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/574,503

(22) Filed: May 19, 2000

Related U.S. Application Data

(63) Continuation of application No. PCT/JP99/05163, filed on Sep. 21, 1999.

(30) Foreign Application Priority Data

Sep. 22, 1998 (JP) .............................. 10-268288

(51) Int. Cl.⁷ ............................................... H01L 39/24
(52) U.S. Cl. ...................... 29/599; 174/125.1; 428/373; 505/431
(58) Field of Search ........................ 29/599; 174/125.1; 505/431; 428/373

(56) References Cited

U.S. PATENT DOCUMENTS 4,999,336 A * 3/1991 Nadkarni et al.
5,106,825 A * 4/1992 Manndigo et al. ............ 29/599
5,654,098 A * 8/1997 Aono et al. ................... 29/599

FOREIGN PATENT DOCUMENTS

| JP | 48-52493 | 7/1973 |
| JP | 9-73821 | 3/1997 |

OTHER PUBLICATIONS

Dr. M. Hansen et al; "Constitution of Binary Alloys"; 1958; p. 119; McGraw–Hill Book Company, Inc.
F.R. Fickett, "A Review of Resistive Mechanisms in Aluminum"; Oct. 1971; Cryogenics, pp. 349–367.

* cited by examiner

Primary Examiner—Carl J. Arbes
(74) Attorney, Agent, or Firm—Frishauf, Holtz, Goodman & Chick, P.C.

(57) ABSTRACT

A method of manufacturing an aluminum-stabilized superconducting wire, which comprises the step of hot-extrusion-coating an entirety or a part of an outer circumference of a superconducting wire (11) which includes a superconducting filament embedded in a copper or copper alloy matrix, with a stabilizer (13) made of a precipitation-type aluminum alloy, is provided. The precipitation-type aluminum alloy is an Al—Ni alloy containing 100 to 25000 ppm of Ni, and the stabilizer made of the precipitation-type aluminum alloy is subjected, prior to the hot extrusion coating step, to an aging-heat treatment in which it is heated at a temperature of 250° C. to 500° C. for 10 minutes or more.

5 Claims, 1 Drawing Sheet

METHOD OF MANUFACTURING ALUMINUM-STABILIZED SUPERCONDUCTING WIRE

CROSS REFERENCE TO RELATED APPLICATIONS

This is a continuation of Application No. PCT/JP99/05163, filed Sep. 21, 1999.

This application is based upon and claims the benefit of priority from the prior Japanese Patent Application No. 10-268288, filed Sep. 22, 1998, the entire contents of which are incorporated herein by reference.

BACKGROUND OF THE INVENTION

The present invention relates to a method of manufacturing an aluminum-stabilized superconducting wire having a high thermal and electrical stability, being resisting to deformation caused by an electromagnetic force generated when employed as a magnet or the like, and having a sufficient mechanical strength, at high productivity.

A superconducting wire is manufactured by embedding a superconducting filament such as an Nb—Ti alloy in a copper or copper-alloy matrix, and providing, usually, a coating of copper as a stabilizer, on its outer circumference.

Recently, an aluminum-stabilized superconducting wire which uses, as a stabilizer, high purity aluminum which has a residual resistance ratio (the ratio of the electrical resistance value at 300 K to that at 10 K) much larger than that of copper has been developed. It should be noted that the residual resistance ratio is an index for the thermal and electrical stability.

Since a density of aluminum is low as about ⅓ of that of copper, the aluminum-stabilized superconducting wire enables to lighten the magnet or the like. Further, since aluminum is superior in terms of elementary particle permeability to copper, the aluminum-stabilized superconducting wire can be advantageously applied for a magnet used for detect elementary particles, which is widely used in the field of high-energy physics.

Such an aluminum-stabilized superconducting wire is manufactured by a method in which aluminum is quickly heated to a temperature of about 350 to 550° C. by induction heating or frictional heat generation, and extruded and applied on the circumference of a superconducting wire such as a single core super-conducting wire or multiple core superconducting wire.

Meanwhile, in a large-size magnet, a strong electromagnetic force is applied to a superconducting wire. Consequently, an aluminum-stabilized superconducting wire, which uses high purity aluminum, may be deformed by such an electromagnetic force. Here, it is considered as one solution that an aluminum-stabilized superconducting wire is cold-worked so as to harden the aluminum stabilizer. However, as to a high purity aluminum stabilizer, even if it is cold-worked, the mechanical strength cannot be markedly improved.

Under these circumstances, a method of using a stabilizer formed of an aluminum alloy in place of high purity aluminum, has been considered.

However, of the aluminum alloys, a solid-solution type aluminum alloy to which a solid-solution type element such as Cu, Zn, Si or Mg has been added, is of a type that the arrangement lattice of aluminum atoms is distorted by solid-solution element, in order to reinforce the aluminum alloy, and therefore it is necessary to dissolve a great amount of alloy elements in order to achieve a high strength. However, if a great amount of solid-solution elements are added, the conductivity is significantly lowered. Therefore, it is very difficult to achieve both a high strength and high conductivity at the same time.

Meanwhile, as to precipitation-type aluminum alloys to which Ni has been added, the solubility limit of Ni with respect to aluminum is extremely low, and therefore most of Ni added will form an intermetallic compound together with Al while solidifying, which precipitates as primary crystal, thereby contributing to the enhancement of the strength, whereas a little amount of the remainder dissolves in a supersaturated manner, thereby decreasing the conductivity significantly.

As a method of age-precipitating such a supersaturated solid-solution element, there is a technique of age-precipitation achieved through a heat history in the extruding machine by decreasing the extrusion rate at the time of hot extrusion coating; however it has a poor productivity and therefore is not practically applicable. Further, it entails a problem that the α-Ti precipitates and introduced dislocations in the Nb—Ti filament disappear due to the heat history in the low-speed extrusion, thereby deteriorating the magnetic flux pinning effect and lowering the magnet property.

Further, there is another method of aging treatment carried out after extrusion covering; however this method also entails a problem that the α-Ti precipitates and introduced dislocations disappear, thereby deteriorating the magnet property.

Under these circumstances, the inventors of the present invention conducted intensive studies on methods of enhancing the conductivity of an aluminum stabilizer which uses a precipitation-type aluminum alloy without lowering the productivity or deteriorating the magnet property. They found that the conductivity of the stabilizer could be improved by performing extrusion covering after carrying out a predetermined aging treatment on a precipitation-type aluminum alloy, and conducted further studies, thus achieving the present invention.

BRIEF SUMMARY OF THE INVENTION

Therefore, the object of the present invention is to provide a method of manufacturing an aluminum-stabilized superconducting wire having a high thermal and electrical stability, being resisting to deformation caused by an electromagnetic force generated when employed as a magnet or the like, and having a sufficient mechanical strength, at high productivity.

According to the present invention, there is provided a method of manufacturing an aluminum-stabilized superconducting wire, comprising the step of hot-extrusion-coating an entirety or a part of an outer circumference of a superconducting wire which includes a superconducting filament embedded in a copper or copper-alloy matrix, with a stabilizer made of a precipitation-type aluminum alloy, wherein the precipitation-type aluminum alloy is an Al—Ni alloy containing 100 to 25000 ppm of Ni, and the stabilizer made of the precipitation-type aluminum alloy is subjected prior to the hot extrusion coating step, to an aging-heat treatment in which it is heated at a temperature of 250° C. to 500° C. for 10 minutes or more.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
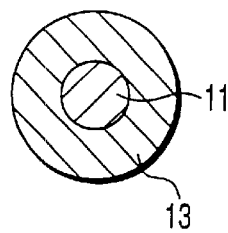
FIGS. 1A to 1G are lateral cross sectional views of various Al-stabilized superconducting wires manufactured by the method of the present invention.

According to the method of the present invention, a precipitation-type Ai—Ni alloy is used as an aluminum serving as a stabilizer for an aluminum-stabilized superconducting wire, and the precipitation-type Al—Ni alloy is subjected to an aging-heat treatment so as to precipitate supersaturated Ni sufficiently, thereafter, a circumference of a superconducting wire material being hot-extrusion coated. Thus, it is possible to manufacture an Al-stabilized superconducting wire of excellent characteristics without deteriorating the productivity.

It should be noted that the above-described precipitation-type Al alloy may be applied on the entire outer circumference of the superconducting wire or on a part thereof, either one of which is similarly effective in the present invention.

In the present invention, the term, super-conducting wire includes: a single core superconducting wire obtained through such a process that an Nb—Ti alloy rod is inserted to a copper or copper alloy pipe to form a composite billet, and the composite billet is hot-extruded to integrate the copper pipe and the Nb—Ti alloy rod together, followed by a rolling or drawing process such as rolling or wire drawing; a multi-core superconducting wire obtained by filling a great number of the above-described superconducting wires into a copper or copper alloy pipe to form a composite billet, and then the billet is processed as described above; a multi-core superconducting twisted wire obtained by twisting a great number of the above-described multi-core superconducting wire together; and an Al-stabilized superconducting wire obtained by coating the circumference of the above-described single core superconducting wire, multi-core superconducting wire, a multi-core superconducting twisted wire or the like, with a high purity Al stabilizer.

In the present invention, the reason why the element added to the precipitation-type aluminum alloy is determined to be Ni, is that the solubility limit of Ni with respect to aluminum is extremely low, and it is possible to precipitate the most of it by the aging-heat treatment.

Further, the reason why the amount of Ni added is determined to be 100 to 25000 ppm is that if less than 100 ppm, the amount added is excessively small, a significantly improvement of the mechanical strength cannot be achieved, whereas if it exceeds 25000 ppm, a decrease in the residual resistance ratio by the precipitates becomes prominent, and therefore even if an aging-heat treatment is carried out, a significant improvement of the residual resistance ratio cannot be achieved.

On the other hand, the reason why the aging-heat treatment of the precipitation-type aluminum alloy is limited to be 250° C. to 500° C. is that if less than 250° C., the diffusion speed is low and it takes a long period of time to precipitate supersaturated Ni, thus lowering the productivity, whereas if it exceeds 500° C., a great amount of Ni dissolves during the aging-heat treatment, and this solid solution element solid-dissolves in great amount even after the hot extrusion coating, thereby lowering the conductivity and making it not possible to achieve a high residual resistance ratio.

The preferable temperature for the aging-heat treatment is 250° C. or more and [extrusion temperature +50° C.] or less, and more preferably, it is 300° C. to 450° C.

Further, the reason why the time duration of the aging-heat treatment is limited to 10 minutes or more is that if less than 10 minutes, the precipitation of the supersaturated Ni is not carried out sufficiently, and therefore a high residual resistance ratio cannot be obtained. From the viewpoint of characteristics, there is not upper limit to the time duration of the aging-heat treatment; however in view of the productivity, the preferable time duration of the aging-heat treatment is 30 minutes to 250 minutes.

In the present invention, Ni is used as the precipitation-type alloy element; however a precipitation-type aluminum alloy to which Ce or Sb having a low solid solution limit with respect to aluminum and forming an intermetallic compound with aluminum during solidification, can obtain an effect similar to that of the present invention as in the case of Ni, if the amount of such an element added is adjusted.

Further, other than the precipitation-type alloy element, one or more elements selected from Ag, As, Bi, Ca, Cd, Cu, Ga, Mg, Pb, Sc, Si, Sn and Zn, each having a low electric resistance increasing rate with respect to aluminum, may be added in such a very fine amount that will not significantly reduce the residual resistance rate, for the purpose of the adjustment of the crystal granularity, the adjustment of the potential or the like, the improvement of the mechanical strength, the improvement of the molding processability, or the like. In this case, the amount of these elements added should be controlled so that the balance between the mechanical strength of the Al-stabilizer and the residual resistance rate can be maintained in a good condition.

Al-stabilized superconducting wires manufactured by the present invention will now be described specifically with reference to accompanying drawings.

FIG. 1A shows an Al-stabilized superconducting wire obtained by extrusion-coating a multi-core Cu/NbTi superconducting wire 11 with a precipitation-type Al alloy stabilizer 13 resulting after the aging-heat treatment.

Figure 1B:
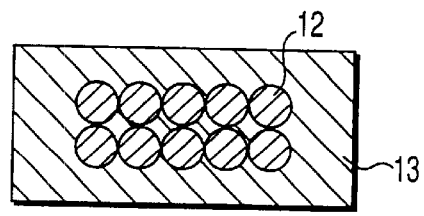

FIG. 1B shows an Al-stabilized superconducting wire obtained by extrusion-coating a multi-core Cu/NbTi superconducting twisted wire 12 with a precipitation-type Al alloy stabilizer 13 resulting after the aging-heat treatment.

Figure 1C:
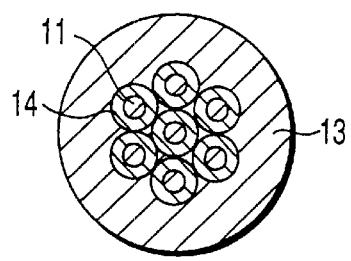

FIG. 1C shows an Al-stabilized superconducting wire obtained by twisting a plurality of multi-core Cu/NbTi superconducting wires 11 each coated with a high purity (99.99 wt %: 5N) Al 14, together, and extrusion-coating them with a precipitation-type Al alloy stabilizer 13 resulting after the aging-heat treatment.

Figure 1D:
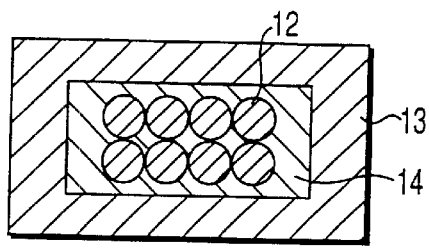

FIG. 1D shows an Al-stabilized superconducting wire obtained by extrusion-coating a multi-core Cu/NbTi superconducting twisted wire 12 with a high purity (5N) Al stabilizer 14, and extrusion-coating it further with a precipitation-type Al alloy stabilizer 13 resulting after the aging-heat treatment.

Figure 1E:
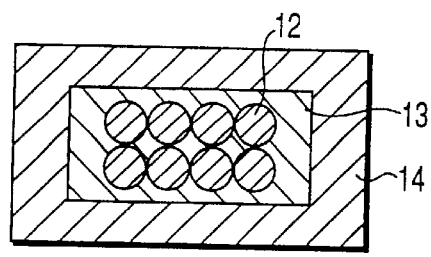

FIG. 1E shows an Al-stabilized superconducting wire obtained by extrusion-coating a multi-core Cu/NbTi superconducting twisted wire 12 with a precipitation-type Al alloy stabilizer 13 resulting after the aging-heat treatment, and extrusion-coating it further with a high purity (5) Al-stabilizer 14.

Figure 1F:
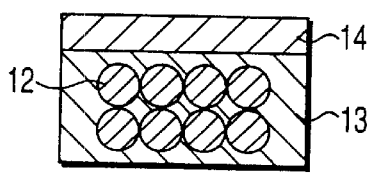

FIG. 1F shows an Al-stabilized superconducting wire obtained by extrusion-coating a multi-core Cu/NbTi superconducting twisted wire 12 with a precipitation-type Al alloy stabilizer 13 resulting after the aging-heat treatment, and soldering a high purity (5) Al-stabilizer 14 to one side thereof after the extrusion coating.

Figure 1G:
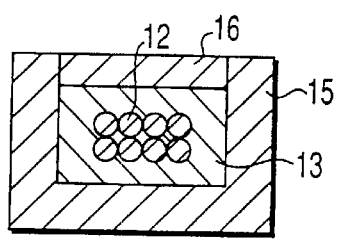

FIG. 1G shows an Al-stabilized superconducting wire obtained by extrusion-coating a multi-core Cu/NbTi superconducting twisted wire 12 with a precipitation-type Al alloy stabilizer 13 resulting after the aging-heat treatment, then soldering it while placed in a copper stabilizer 15 having substantially a U-shaped cross section, and soldering a plate-like copper stabilizer 16 to an open section thereof.

EXAMPLES

Various examples of the present invention will now be presented to describe the invention in more detail.

Example 1

313 pieces of single core superconducting wires in each of which a NbTi alloy wire was embedded in a copper matrix, were filled into a pipe made of an oxygen-free copper (having an outer diameter of 220 mm and an inner diameter of 200 mm) to form a composite billet. Subsequently, the composite billet was subjected to a hot extrusion process and a wire drawing process, thus manufacturing a multi-core Cu/NbTi superconducting wire having an outer diameter of 0.6 mm.

In the meantime, a precipitation type Al alloy material, in which 1000 ppm of Ni was contained in a high purity (5) Al, was prepared, and it was subjected to an aging-heat treatment under various conditions within a range of the present invention. Then, an outer circumference of the above-described multi-core Cu/NbTi superconducting wire was extrusion-coated with the processed material at 450° C., thus obtaining an Al-coated rod having an outer diameter of 2.4 mm.

Next, the Al-coated rod was subjected to a cold wire drawing process to have an outer diameter of 2.1 mm, and thus 8 types of aluminum-stabilized superconducting wires such as shown in FIG. 1A was obtained.

Example 2

3 types of aluminum-stabilized superconducting wires such as shown in FIG. 1A was obtained in a similar manner to that of Example 1 except that an Al—Ni alloy, in which 100 ppm of Ni was contained in a high purity (5N) Al, was used as the precipitation-type Al—Ni alloy, and it was subjected to an aging-heat treatment under various conditions within a range of the present invention.

Example 3

3 types of aluminum-stabilized superconducting wires such as shown in FIG. 1A was obtained in a similar manner to that of Example 1 except that an Al—Ni alloy, in which 25000 ppm of Ni was contained in a high purity (5N) Al, was used as the precipitation-type Al—Ni alloy, and it was subjected to an aging-heat treatment under various conditions within a range of the present invention.

Comparative Example 1

13 types of aluminum-stabilized superconducting wires such as shown in FIG. 1A was obtained in a similar manner to that of Example 1 except that the conditions for the aging-heat treatment carried out on the precipitation-type Al alloy material were changed in various ways out of the range defined by the present invention.

With regard to each of the aluminum-stabilized superconducting wires such as shown in FIG. 1A, which were manufactured in Examples 1 to 3 and Comparative Example 1 were examined in terms of the residual resistance ratio, 0.2% proof strength (mechanical strength) at 4.2 K, critical current value (to be abbreviated as Ic hereinafter), and magnet properties (that is, quench current and maximum magnetic field generated). The results were summarized in TABLE 1 below.

It should be noted that Ic was measured in the following manner. That is, a short wire piece having a length of 1 m was cut from the obtained aluminum-stabilized superconducting wires, and a current is allowed to flow in the wire piece while it was placed in a liquid He (4.2 K) with application of a magnetic field of 5T. Then, the current was gradually increased, and the current value at the point when the resistance reached $10^{-13}$ Ωm, was determined.

With regard to the quench current and the maximum magnetic field generated, each of thus obtained aluminum-stabilized superconducting wires was wound to form a respective coil having an inner diameter of 20 mm and an outer diameter of 150 mm, and thus magnets were prepared. The quench current was defined as a current at the point where the super-conductive state of the magnet was broken, and the maximum magnetic field generated was measured by means of a hall element placed at the center. It should be noted that each magnet was designed such that it would generate a magnet field of 5T when a current of 276 A was made to flow.

TABLE 1

| | Amount of Ni added (ppm) | Heat treatment conditions | | Residual resistance ratio | | 0.2% proof strength of wire | | | Maximum magnetic |
|---|---|---|---|---|---|---|---|---|---|
| | | Temperature (° C.) | Time (min) | Extrusion material | Wire drawing material | drawing material (Mpa) | Ic (5T) (A) | Quench current (A) | field generated (T) |
| Products of the present invention | | | | | | | | | |
| 1 | 1000 | 250 | 10 | 320 | 290 | 112 | 277 | 277 | 5.02 |
| 2 | | 250 | 360 | 980 | 500 | 113 | 278 | 280 | 5.07 |

TABLE 1-continued

|  | Amount of Ni added (ppm) | Heat treatment conditions | | Residual resistance ratio | | 0.2% proof strength of wire | | | Maximum magnetic field generated (T) |
|---|---|---|---|---|---|---|---|---|---|
|  |  | Temperature (° C.) | Time (min) | Extrusion material | Wire drawing material | drawing material (Mpa) | Ic (5T) (A) | Quench current (A) |  |
| 3 |  | 350 | 120 | 1240 | 550 | 114 | 279 | 284 | 5.14 |
| 4 |  | 450 | 10 | 910 | 470 | 112 | 278 | 280 | 5.07 |
| 5 |  | 450 | 120 | 1200 | 480 | 115 | 278 | 284 | 5.14 |
| 6 |  | 450 | 500 | 1280 | 510 | 115 | 278 | 285 | 5.16 |
| 7 |  | 500 | 10 | 610 | 370 | 111 | 279 | 278 | 5.03 |
| 8 |  | 500 | 120 | 430 | 300 | 114 | 277 | 277 | 5.01 |
| 9 | 100 | 250 | 10 | 380 | 320 | 79 | 278 | 277 | 5.02 |
| 10 |  | 450 | 500 | 1420 | 620 | 80 | 278 | 278 | 5.03 |
| 11 |  | 500 | 120 | 460 | 300 | 77 | 277 | 276 | 5.00 |
| 12 |  | 250 | 10 | 300 | 250 | 175 | 276 | 276 | 5.00 |
| 13 | 25000 | 450 | 500 | 350 | 280 | 176 | 277 | 277 | 5.02 |
| 14 |  | 500 | 120 | 310 | 260 | 176 | 276 | 276 | 5.00 |
| Products of Comparative example |  |  |  |  |  |  |  |  |  |
| 15 | 1000 | No heat treatment | | 150 | 130 | 115 | 276 | 216 | 3.91 |
| 16 |  | 220 | 10 | 190 | 170 | 117 | 277 | 225 | 4.07 |
| 17 |  | 220 | 350 | 250 | 200 | 117 | 277 | 230 | 4.16 |
| 18 |  | 450 | 5 | 280 | 230 | 120 | 277 | 272 | 4.93 |
| 19 |  | 530 | 10 | 240 | 210 | 117 | 276 | 236 | 4.27 |
| 20 |  | 530 | 120 | 240 | 200 | 114 | 276 | 229 | 4.15 |
| 21 | 100 | 220 | 120 | 280 | 230 | 81 | 276 | 273 | 4.94 |
| 22 |  | 530 | 120 | 270 | 220 | 79 | 277 | 272 | 4.93 |
| 23 | 25000 | 220 | 120 | 150 | 120 | 173 | 276 | 208 | 3.77 |
| 24 |  | 530 | 120 | 200 | 160 | 172 | 276 | 230 | 4.16 |
| 25 | 50 | 450 | 500 | 1450 | 700 | 60 | 276 | 232 | 4.20 |
| 26 | 30000 | No heat treatment | | 100 | 80 | 185 | 276 | 220 | 3.98 |
| 27 |  | 450 | 500 | 170 | 140 | 185 | 275 | 223 | 4.04 |

As is clear from TABLE 1 above, all of the aluminum-stabilized superconducting wires (No. 1 to 14) of the examples of the present invention exhibit high values in the residual resistance, 0.2% proof strength and Ic, and indicated very good magnetic properties (quench current and maximum magnetic field generated) such as a quench current of 277 A or more and a maximum magnetic filed generated exceeding 5T.

As compared to the above, with regard to all of the product No. 15 of the comparative example, which was not subjected to an aging-heat treatment, the products No. 16, 17, 21 and 23, which were subjected to an aging-heat treatment but at low temperature, and the product No. 18, which was subjected to an aging-heat treatment but in an excessively short time, impurity elements which were dissolved in an over-saturated state could not be precipitated sufficiently.

On the other hand, as to the products No. 19, 20, 22 and 24, since the aging-heat treatment temperature was excessively high. As a result, the solubility limit of the impurity element with respect to aluminum became large, and therefore the dissolved amount was large. Further, in the case of the product No. 25, the Ni precipitation amount was excessively small. Therefore, although the residual resistance value was high, the mechanical strength was low, and it quenched due to mechanical disturbance.

As to the products No. 26 and 27, the Ni precipitation amount was large, and therefore the amount of intermetallic compound was large. As a result, the residual resistance value was excessively low, and the effect of the aging-heat treatment was not obtained.

As described above in detail, in the present invention, as the aluminum stabilizer for an aluminum-stabilized superconducting wire, a precipitation-type Al—Ni alloy having an amount of Ni added of 100 to 25000 ppm is used, and the precipitation type Al—Ni alloy is subjected to an aging-heat treatment for a predetermined temperature and time, and then it is applied through extrusion-coating on a superconducting wire. Thus, an aluminum-stabilized superconducting wire having a high thermal and electrical stability, being resisting to deformation caused by an electromagnetic force generated when employed as a magnet or the like, and having a sufficient mechanical strength, can be obtained at high productivity.

Therefore, the method of the present invention exhibits an industrially remarkable effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an aluminum-stabilized superconducting wire, comprising the step of hot-extrusion-coating an entirety or a part of an outer circumference of a superconducting wire which includes a superconducting filament embedded in a copper or copper-alloy matrix, with a stabilizer made of a precipitation-type aluminum alloy, wherein the precipitation-type aluminum alloy is an Al—Ni alloy containing 100 to 25000 ppm of Ni, and the stabilizer made of the precipitation-type aluminum alloy is subjected prior to the hot extrusion coating step, to an aging-heat treatment in which it is heated at a temperature of 250° C. to 500° C. for 10 minutes or more.

2. A manufacturing method according to claim 1, wherein the aging-heat treatment is carried out at a temperature of 250° C. or more and or less.

3. A manufacturing method according to claim 1, wherein the precipitation-type aluminum alloy is an Al—Ni alloy containing at least one selected from the group consisting of As, Bi, Ca, Cd, Cu, Ga, Mg, Pb, Sc, Si, Sn and Zn.

4. A manufacturing method according to claim 1, wherein the superconducting wire is made of a plurality number of superconducting filaments embedded in a copper or copper alloy matrix, and an outer circumference thereof is coated with a stabilizer made of a high purity aluminum.

5. A manufacturing method according to claim 1, further comprising the step of coating an entirety or a part of the circumference of the superconducting wire coated with the stabilizer, made of high purity aluminum or copper, after the hot extrusion coating step.

* * * * *